United States Patent [19]

Hutchinson et al.

[11] 4,369,287

[45] Jan. 18, 1983

[54] PERMANENT FLUXING AGENT AND SOLDER-THROUGH CONFORMAL COATING

[75] Inventors: Wendell R. Hutchinson; John D. Shurboff, both of Coral Springs, Fla.

[73] Assignee: Motorola Inc., Schaumburg, Ill.

[21] Appl. No.: 243,980

[22] Filed: Mar. 16, 1981

[51] Int. Cl.³ .......................... C08K 5/01; C08K 5/13; B32B 15/00; C08F 20/04
[52] U.S. Cl. ................... 524/700; 428/385; 428/461; 524/379; 524/439; 524/768; 526/317
[58] Field of Search ............ 526/317; 260/33.6 UA, 260/33.4 PQ; 428/385, 461; 524/379, 439, 700, 768

[56] References Cited

U.S. PATENT DOCUMENTS

| | | | |
|---|---|---|---|
| 628,541 | 7/1899 | Kester | 428/166 |
| 1,615,094 | 1/1927 | McFarland | 72/256 |
| 2,079,710 | 5/1937 | Jacobson | 428/385 |
| 2,715,616 | 8/1955 | MacIntosh | 260/27 R |
| 3,361,702 | 1/1968 | Wartman et al. | 260/33.4 PQ |
| 3,389,109 | 6/1968 | Harmon et al. | 260/29.6 |
| 3,485,783 | 12/1969 | Kehe | 260/27 R |
| 3,520,861 | 7/1970 | Thomson et al. | 428/500 |
| 3,541,033 | 12/1970 | Buttrick et al. | 260/8 |
| 3,554,957 | 1/1971 | Van Tilburg | 260/33.6 UA |
| 3,557,037 | 1/1971 | Collins | 260/33.6 UA |
| 3,578,630 | 5/1971 | Rieke et al. | 260/41 |
| 3,607,813 | 9/1971 | Purcell et al. | 260/29.6 |
| 3,793,288 | 2/1974 | Elder | 260/41 A |
| 3,814,737 | 6/1974 | Gilbert et al. | 526/317 |
| 3,853,606 | 12/1974 | Parkinson . | |
| 4,190,565 | 2/1980 | Cook et al. | 260/27 R |
| 4,192,788 | 3/1980 | Dodson | 260/27 R |
| 4,239,812 | 12/1980 | Boynton | 260/27 R |
| 4,283,317 | 8/1981 | Murphy et al. | 260/27 R |
| 4,289,669 | 9/1981 | Lakshmanan | 260/27 EV |
| 4,296,019 | 10/1981 | Nelson et al. | 260/33.6 UA |

OTHER PUBLICATIONS

"The 'Bottomless Solder Bucket'", J. R. Getten, A. B. Strines and J. F. Turner, *Welding Journal*, Nov. 1974, pp. 696–702.
"Solving Interconnection Problems in Big Multilayer PC Boards", P. O. Behman, *Electronics*, Oct. 11, 1971.
"A-C® Polyethylene Homopolymers and Copolymers", Allied Chemical, Morristown, N.J.
"A-C® Polyethylenes and Copolymers for Hot Melt Adhesives", Allied Chemical Company, Morristown, N.J.
"A-C Copolymer 540A", Allied Chemical Company, Morristown, N.J.
"The Properties and the Preparation of A-C Polyethylene Gels", Allied Chemical Company, Plastics Division, Morristown, N.J.

*Primary Examiner*—H. S. Cockeram
*Attorney, Agent, or Firm*—James W. Gillman; James S. Pristelski; Margaret Marsh Parker

[57] ABSTRACT

An ethylene-acrylic acid copolymer can be used as a flux or a solder-through conformal coating. The copolymer can be melted and used as a coating or core for solder, or applied directly to a component, or made into a thixotropic gel with mineral spirits and/or alcohol, then applied as a coating to a component or assembly. Terpenes may be added as tackifiers in some applications. Whether used as a flux or simply solder-through coating, the material provides a self-healing moisture barrier which can safely remain on the component.

14 Claims, No Drawings

PERMANENT FLUXING AGENT AND SOLDER-THROUGH CONFORMAL COATING

BACKGROUND OF THE INVENTION

This invention relates to the field of fluxes and coatings for electronic components and devices and, more particularly, to moisture-proof coatings with solder-through capability and fluxing action.

Conformal coatings for electronic components and assemblies are well known and include the waxes used for temporary coating before, the soldering process and, as permanent coatings after assembly, thermo-setting materials such as acrylics, polyurethane, epoxies, silicones, and styrene. There are a number of serious disadvantages to each of these known materials such as the detuning effect due to high dielectric constant, electromigration effects due to moisture absorption, non-solder-through characteristic and non-repairable characteristic. For example, in the case of silicon coating materials, the silicone actually forms a chemical bond with many materials such as the surface of a printed circuit board and cannot be completely removed. Most other coatings must be scraped off thoroughly if replacement of a component is necessary, and then there is no simple way to replace the protective coating in the field. Also, there has been no way to coat components or assemblies for temporary storage before soldering without having to thoroughly remove the coating before the soldering process could proceed.

In soldering processes, whether hand soldering or mechanized; e.g. wave or flow soldering, a flux must be used first to prepare the surfaces to accept solder. While rosin fluxes have been widely used in electrical products to reduce corrosion at the soldered connections, it has also been the practice to remove all rosin remaining on the product after the soldering process. This additional step has been necessary because, while rosin flux is nearly inert when completely dry, residual activators may be sufficiently acid in the presence of slight humidity to allow the growth of metal "whiskers" (electromigration) between two adjacent points or areas having a voltage difference between them. Also, the moisture absorbed by rosin can, in certain circumstances, detune a circuit.

Another desirable coating application would be the capability for temporary non-contact, as of battery connections during a storage period, with a simple heating step allowing the contact to be made at the appropriate time, no contact cleaning being required before or after heating. Another application would be the elimination of the need for gold plating on contacts by the use of a coating which first protects from oxidation, then acts as a flux for the soldering process.

A solder flux has been developed for a specific "solder bucket" application which includes an oxidized homopolymer of polyethylene, suberic acid and fumed mica. The acid is suspended in the polyethylene and is the active fluxing agent. The mica acts as a thickening agent which is required in the particular application. Since oxidized polyethylene is somewhat hydrophilic, slight amounts of water can be absorbed, changing the dielectric constant significantly and thus affecting the tuning in some devices. Since the acid is not chemically bound to the polyethylene, it can migrate and cause high impedance shorts between electrical components, particularly when a substantial voltage differential exists.

SUMMARY OF THE INVENTION

It is therefore an object of the present invention to provide a moisture-barrier conformal coating with solder-through capability and repairability.

It is another object to provide a coating which can also serve as a solder flux.

It is another object to provide a coating which will prevent electrical contact between two elements until a heating step is performed.

It is an additional object to provide a coating which will prevent oxidation, then provide fluxing, eliminating the need for precious metal plating.

It is another object to provide a conformal coating which can be made as thick or thin as desired, and can be applied by a variety of techniques.

These objects and others which will become apparent are provided by a copolymer of polyethylene-acrylic acid which may be used alone, or in a gel with a solvent such as mineral spirits, with or without the addition of a tackifier such as a terpene. By varying the viscosity of the mixture, application may be by dipping, spraying or brushing on, etc., and can also be a coating on or core in solder for direct use as a flux for normal hand soldering.

DETAILED DESCRIPTION OF A PREFERRED EMBODIMENT

Definitions and Characteristics of Materials

The preferred ethylene-acrylic acid copolymers have the following characteristics:

| TYPE | SOFTENING Point °C. | HARDNESS dmm | DENSITY g/cc | VISCOSITY cps 140° C. | ACID NO. mgKOH/g | ETHYL./ACID Ratio |
|---|---|---|---|---|---|---|
| A-C® 540A | 108 | 2.0 | .93 | 500 | 40 | 51/949 |
| A-C® 580 | 102 | 4.0 | .93 | 650 | 75 | 96/904 |
| A-C® 5120 | 92 | 11.5 | .93 | 650 | 120 | 154/846 |

These particular copolymers are marketed by Allied Chemical Corp., and are typically supplied in small pellet (prill) or powder form. They are highly hydrophobic, have low dielectric constants, low molecular weight and are linear with medium density. The molecular weights are in the range of about 2,000 to about 3,000. The densities are in the range of about 0.93 to 0.95.

The preferred "tackifiers" are polymerized terpenes which serve to "wet" the surface in all but very thin coatings. The terpenes may or may not include acids, depending on the particular application, and have a chemical structure very similar to that of the copolymer; that is, both structures have only a limited amount of branching. Thus the molecular chains of the tackifier tend to support the pack structure of the polyethylene acrylic acid.

"Mineral spirits" may be any aliphatic hydrocarbon solvent which is similar in structure to polyethylene.

"Alcohol" is a hydroxy functional alkyl hydrocarbon of the general form R—OH.

A "thixotropic" gel is a colloidal solution which moves from a gel to a liquid when mechanically disturbed. The chief advantage of a thixotropic gel is that, in the gel form, solvent loss is greatly reduced yet stirring will quickly bring the solution to the desired consistency for application. Refrigeration of the prepared gel further reduces solvent loss.

"Electromigration" is the movement of ions in a field, and can cause the growth of metal "whiskers" between two adjacent conductors. As in a plating, both the presence of acid molecules and water molecules are conducive to such migration. Therefore, if the acid molecules are chemically bound, as in the present copolymer chains, so that they cannot combine with any moisture present in the atmosphere, electromigration is essentially impossible.

The significance of density of the polyethylene lies in the fact that as density increases, the polymer becomes more linear, crystallinity increases and it becomes less permeable to moisture. The copolymers chosen for this application combine adhesion, solubility and moisture resistance and are of medium density.

"Acid number" is the percent of acid (by weight) in the final product (after solvent evaporation).

GENERAL CONSIDERATIONS

There are a number of considerations which are worth noting in regard to the flux coating in general. While, as already noted, it is not required to use a solvent, application of the coating in a gel form has many practical advantages. The coating has been applied by being brushed on and by immersion. The viscosity of the flux coating solvent mix must be lowered sufficiently to be readily applied by pressurized spray application. In some applicants, a thin solution has been brushed on the edges of a component or assembly and drawn by capillary action into an internal area to be soldered then or later.

The gel formed by any of the processes described herein is applied to a component or assembly, then allowed to dry to remove the solvents (if any). Drying is usually done in a forced air oven at a temperature significantly above room temperature, but well below the melting point. In most applications, the assemblies are then reheated above the melting point for a few minutes. This fuses any surface cracks which may have appeared during the drying period and, more importantly, allows more of the acrylic acid ends of the polyethylene chains to become bonded to the surface of the coated object.

A METHOD OF PREPARATION

An example is given below of a method of preparation of a coating which may be applied when a component is first made and before oxidation could occur or any portions requiring subsequent solderability. Quantities given are exemplary only and are not to be considered limiting in any manner. The copolymer could be an ethylene-organic acid such as the ethylene-acrylic acid copolymer manufactured by Allied Chemical Corporation and known as AC © Copolymer 540A. This material was developed specifically for use in Nylon 6 resins for molding, extruding, etc., where it improves mold release and other such characteristics.

For the present invention 24 gm of powdered ethylene-acrylic acid copolymer A-C 540A are heated to the melting point (108° C.). Then, still over heat, 240 ml of mineral spirits are gradually stirred into the molten material. The mixture is then removed from the heat and stirred constantly until the "cloud point" is reached. The cloud point is that temperature at which a clear solution of polyethylene or copolyethylene and a given solvent begins to turn cloudy. At this temperature, precipitation of the polyethylene begins to occur. The mixture is then returned to a hot plate until the solution just clears. The mixture is then transferred to a cold plate, a chilled Teflon stirring rod is dropped in and vigorous stirring is begun, while 120 ml of chilled mineral spirits is dumped in. Stirring is continued until the mixture begins to thicken, then stirring is stopped occasionally to check the consistency since the gel is a thixotropic mixture. More mineral spirits, at room temperature, may then be added to obtain the desired viscosity for the particular method of application. A polymerized terpene may be added at this point to enhance the adhesion of the coating; up to 20% by weight of the solids in the solution.

The shock cooling method will produce a gel with extremely small particles. When the gel is let stand, the particles form a three dimensional lattice structure. This flux coating will maintain its viscosity best if sealed and refrigerated, and may be applied in any suitable fasion such as dipping, brushing, or spraying, with air drying followed by oven baking to fuse the coating to the surfaces. This coating may be used on any electrical component or device where it is desirable to provide moisture protection and corrosion resistance while allowing soldering through after coating. Since polyethylene is a thermoplastic, not thermosetting, material, during the soldering process the heated coating will move aside and allow the solder to flow down to the desired point. If the coating was applied before oxidation of the solder points became excessive, the acid in the coating will act as a flux. After soldering, the coating will tend to flow back to the original condition so that, in most cases, the repair job is essentially invisible. If desired, a small amount of the gel can be applied after the repair or replacement is complete.

If a much thicker coating is desired, the mineral spirits may be reduced or eliminated. However, if no solvent at all is used, the copolymer must be molten when applied and it may be necessary to do the coating in a vacuum. Slightly thicker coatings may be preferable if it is desired to do soldering after the component or assembly is coated, as for repair or component replacement, as more acid is then available for fluxing. Additionally, a slightly thicker coating is more likely to self-heal after soldering.

Softer copolymers, A-C 580 or 5120, having higher acid numbers than A-C 540A, can also be used with good results, since they provide better adhesion. When heating A-C 5120 with mineral spirits, the solution is preferably cooled slowly (no shock cooling) to reduce precipitate particle size.

FORMULATION EXAMPLES

| | COPOLYMER | SOLVENT | | TACKIFIER (Terpene) | |
|---|---|---|---|---|---|
| | | MINERAL | | | |
| | QUANTITY | SPIRITS | ALCOHOL | % of | |
| TYPE | (gms) | (ml) | (ml) | Polymer | ACID NO. |
| 1 A-C 540 | 24 | 360–540 | — | 0–20 | 32–40 |
| 2 A-C 540 | Any | — | — | 0–20 | 32–40 |
| 3 A-C 580 | Any | — | — | 0–20 | 60–75 |
| 4 A-C 580 | 160 | 100 | — | 0–25 | 56–75 |
| 5 A-C 580 | 30 | 140 | 70 | 0–20 | 60–75 |
| 6 A-C 580 | 30 | 230–290 | 100–140 | 0–20 | 60–75 |
| 7 A-C 580 | 30 | 320–500 | 160–250 | 0–20 | 60–75 |
| 8 A-C 5120 | 15–25% | 85–75% | — | 0–20 | 96–120 |
| 9 A-C 5120 | 20 | 30–60 | 0–40 | — | 120 |

The examples given in the above chart are not to be considered limiting, but merely to suggest the many possibilities of the invention. For example, formulations #1 and #2 would have the same characteristics after application except that #2 would provide a much thicker coating. #3 would be similar to #2, but with a higher acid number. #4 is particularly suited to being applied by dipping the component or the solder into the gel or could form a solder core. #5, #6 and #7 are increasingly thinner gels for application by brushing or spraying. #8 and 9 have still higher acid numbers, depending on the amount of tackifier, and are fairly thick formulations as for dipping. Examples 1–2 could use water white rosin as the tackifier, while examples 3–8 could use Zonatac 105, manufactured by Arizona Chemical Company. The latter dissolves readily in alcohol. Although the copolymer does not form a gel with alcohol, the alcohol and Z105 solution can be added to a gel with no deleterious effects. In general, the higher acid formulations have lower melt temperatures and are softer, thus less abrasion resistant. Formulations may also include portions of two different copolymers to achieve a final product with intermediate characteristics.

It should be noted that other ethylene-organic acid copolymers, with other acid numbers, are available as well and may be preferred for certain applications. In all formulations which are usable for the fluxing applications, however, the acid must be chemically bound to the polyethylene, which is essentially water impermeable, so that the acid cannot be freed except during the soldering process. In the present formulation, the acrylic acid is molecularly attached to one end of the polyethylene chain and this end chemically bonds to the surface of the coated object. This increases the adhesion of the coating and ensures that the acid-free end of the chain is oriented toward the outer surface of the coating. Since the outer surface thus has a highly hydrophobic composition, condensation and moisture intrusion are essentially nonexistent and electromigration is effectively prevented.

Therefore, when the above-described fluxing material remains on a component or assembly, it cannot cause the problems caused by the usual rosin flow. This is particularly desirable in applications where a low moisture absorbing conformal coating is needed, but where it may also be necessary to replace a component in the field. The coating can easily be soldered through and, in many applications, will reseal itself upon coating. If desired, a small amount of the fluxing material can be added during the soldering process, or brushed or sprayed on after the component replacement is completed.

There has been described a conformal coating and fluxing agent which prevents corrosion while allowing solder-through capability. Other modifications and variations are possible and it is intended to cover all such as fall within the spirit and scope of the appended claims.

What is claimed is:

1. A method of providing a flux and solder-through coating for electrical components or assemblies and comprising the steps of melting a copolymer of ethylene and an organic acid, the copolymer having a molecular weight of about 2000 to about 3000, having a density of about 0.93 to about 0.95 and the ratio of ethylene to acid being from about 40/975 to about 160/825, and of applying the coating to a component or assembly.

2. The method according to claim 1 wherein the organic acid is acrylic acid.

3. The method according to claim 1 and including the step of adding to the molten material a solvent in a proportion not exceeding thirty parts of solvent to one part copolymer.

4. The method according to claim 3 wherein the solvent is an aliphatic hydrocarbon.

5. The method according to claim 3 wherein the solvent comprises a combination of an aliphatic hydrocarbon and an alcohol.

6. The method according to claim 3 and further including the steps of allowing the mixture to cool to the "cloud point", heating the mixture until clearing occurs, chilling the mixture, and stirring the mixture.

7. The method according to claim 6 and further including the step of adding additional solvent at room temperature to adjust to a predetermined viscosity.

8. The method according to claim 7 and further including the step of adding a polymerized terpene to the mixture, the amount of terpene not to exceed 20% by weight of the solids in the solution.

9. The method according to claim 1 and including the step of adding the mixture to solder.

10. The method according to claim 7 and including the steps of drying the applied flux/coating to remove any solvents.

11. The method according to claim 10 and including the step of reheating the dried flux/coating to fuse any surface cracks and promote additional bonding of the acid to the surface of the component or assembly.

12. A flux and solder-through coating for electrical components or assemblies and comprising:
   a copolymer of ethylene and an organic acid, the copolymer having a molecular weight of about 2000 to about 3000, having a density of about 0.93 to about 0.95, and the ratio of ethylene to acid being from about 40/975 to about 160/825;
   an aliphatic hydrocarbon; and
   a terpene.

13. A flux and solder-through coating according to claim 12 wherein the organic acid is acrylic acid.

14. A flux and solder-through coating according to claim 12 wherein the terpene is polymerized.

* * * * *